(12) United States Patent
Chow et al.

(10) Patent No.: US 8,473,878 B2
(45) Date of Patent: Jun. 25, 2013

(54) LITHOGRAPHICALLY ENHANCED EDGE DETERMINATION

(75) Inventors: Tatung Chow, San Jose, CA (US);
Changqing Hu, Sunnyvale, CA (US);
Donghwan Son, Cupertino, CA (US);
David H. Kim, Santa Clara, CA (US);
Thomas C. Cecil, Menlo Park, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/305,650

(22) Filed: Nov. 28, 2011

(65) Prior Publication Data

US 2013/0139116 A1    May 30, 2013

(51) Int. Cl.
*G06F 17/50* (2006.01)
(52) U.S. Cl.
USPC .................. 716/55; 716/50; 716/51; 716/52; 716/53; 716/54
(58) Field of Classification Search
USPC ..................................... 716/50, 51, 53, 54, 55
See application file for complete search history.

(56) References Cited

U.S. PATENT DOCUMENTS

| 7,030,997 B2 * | 4/2006 | Neureuther et al. ........... 356/515 |
| 2011/0209107 A1 * | 8/2011 | Kodera et al. .................... 716/55 |
| 2011/0222739 A1 * | 9/2011 | Zhou et al. ..................... 382/112 |

\* cited by examiner

*Primary Examiner* — Nha Nguyen
*Assistant Examiner* — Brian Ngo
(74) *Attorney, Agent, or Firm* — Fenwick & West LLP

(57) ABSTRACT

During a calculation technique, at least a portion of a target pattern associated with an integrated-circuit design is modified so that polygons in the target pattern, which represent features in the design, result in acceptable accuracy during a photolithographic process that fabricates the target pattern on a semiconductor die. In particular, a set of polygon parameters associated with the polygons are modified, as needed, so that a cost function that corresponds to a difference between a modified target pattern and an estimated target pattern produced during the photolithographic process meets a termination criterion. A mask pattern that can fabricate the modified target pattern on the semiconductor die is calculated using an inverse optical calculation in which the modified target pattern is at an image plane of an optical path associated with the photolithographic process and the mask pattern is at an object plane of the optical path.

21 Claims, 9 Drawing Sheets

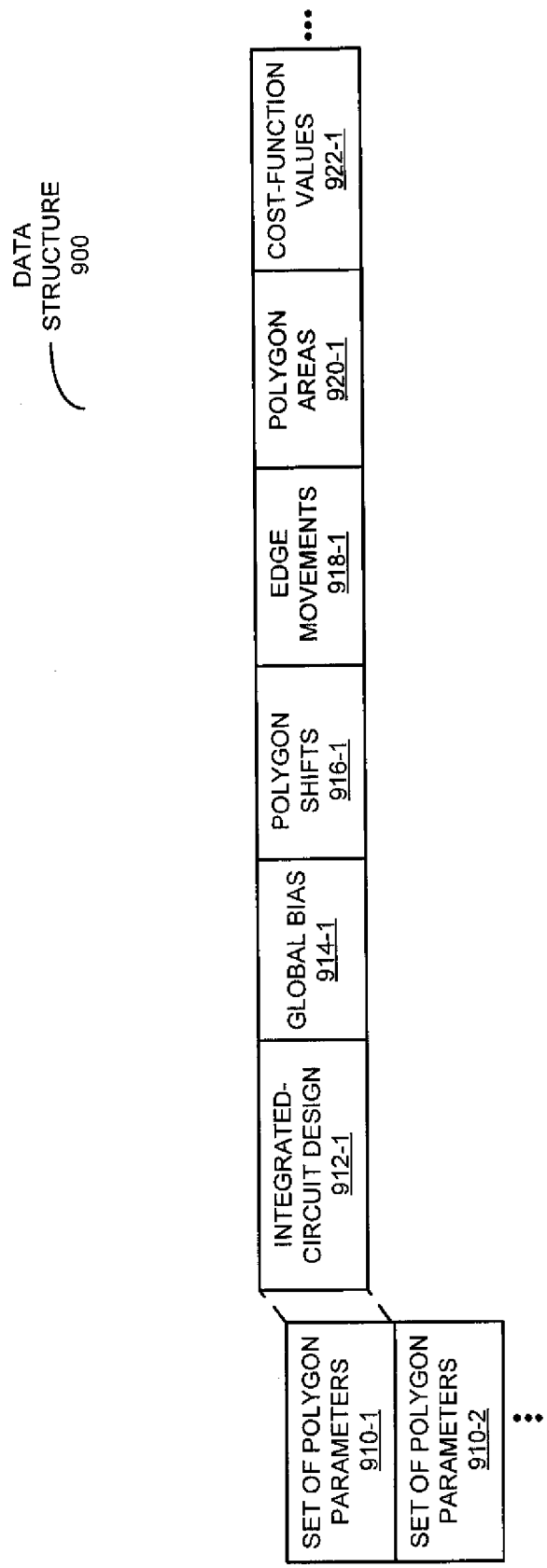

LITHOGRAPHICALLY ENHANCED EDGE DETERMINATION

BACKGROUND

1. Field

The present invention relates to systems and techniques for determining target patterns that represent integrated-circuit designs.

2. Related Art

Lithography processing represents an essential technology for manufacturing Integrated Circuits and Micro-Electro-Mechanical Systems (MEMS) and Nano-Electro-Mechanical Systems (NEMS). Lithographic techniques are used to define: patterns, geometries, features, shapes, etc. onto an integrated-circuit die, semiconductor wafer, or chips. These patterns are typically defined by: a set of contours, lines, boundaries, edges, curves, etc., which generally surround, enclose, and/or define the boundary of the various regions which constitute the patterns.

One existing lithographic technique is photolithography, in which images defined by photo-masks are printed onto an integrated-circuit die or one or more semiconductor wafers. Unfortunately, it is increasingly difficult to design and manufacture photo-masks.

In particular, demand for increased density of features on the integrated-circuit die and the one or more semiconductor wafers has resulted in the design of circuits with decreasing minimum dimensions. These trends have significantly increased the complexity of the computations necessary to determine the mask patterns (to which the photo-masks correspond), with a commensurate impact on computation time, processing requirements, and expense.

Furthermore, due to the wave nature of light, as dimensions approach sizes comparable to the wavelength of the light used in the photolithography processes, the resulting wafer patterns deviate from the corresponding photo-mask patterns and are accompanied by unwanted distortions and artifacts. Existing techniques (such as Optical Proximity Correction or OPC, and Resolution Enhancement Technologies or RET) are used to pre-distort the mask patterns to improve resolution and/or a process window (e.g., a range of process conditions that result in acceptable yield) in a photolithography process. While these techniques may ensure that the wafer pattern is printed more accurately, determining the pre-distorted mask patterns is increasingly difficult, thereby exacerbating the computational complexity and the associated problems.

Additionally, integrated-circuit designers typically 'tape out' a final design of an integrated circuit for manufacture as one or more target patterns in a file format that includes polygons (which represent boundaries in the integrated circuit), such as those associated with a Graphic Design System format. However, the integrated-circuit designers usually only consider logic requirements and electrical characteristics when generating the target patterns. As a consequence, the polygons in the target patterns may not be lithographically optimal, i.e., they may result in large variations in the wafer patterns produced during the photolithography process.

Hence, what is needed is a method and an apparatus that facilitates determination of target patterns without the above-described problems.

SUMMARY

The present disclosure relates to a computer system to determine a modified target pattern associated with an integrated-circuit design. During operation, the computer system receives at least a portion of a target pattern associated with the integrated-circuit design, where the target pattern includes polygons that represent features in the integrated-circuit design. Then, the computer system determines a set of polygon parameters in the modified target pattern, where the set of polygon parameters include polygon positions in the modified target pattern and areas of the polygons. Moreover, the computer system calculates a mask pattern that can be used in a photolithographic process to fabricate the modified target pattern on a semiconductor die, where the mask pattern is calculated using an inverse optical calculation in which the modified target pattern is at an image plane of an optical path associated with the photolithographic process and the mask pattern is at an object plane of the optical path. Next, the computer system evaluates a cost function to determine if a termination criterion is met, where the cost function corresponds to a difference between the modified target pattern and an estimated target pattern produced during the photolithographic process at the image plane using the mask pattern at the object plane. If the termination criterion is not met, the computer system revises the set of polygon parameters, repeating the calculation of the mask pattern and the evaluating of the cost function until the termination criterion is met.

Note that, prior to calculating the mask pattern, the polygons may have the same area.

Furthermore, the set of polygon parameters may include placement of edges in each of the polygons, where placement of a given edge in a given polygon is along a direction perpendicular to the given edge. In some embodiments, the given edge may be subdivided into portions of the given edge that may be independently positioned so that they may be offset along the direction from each other.

When the set of polygon parameters is revised, the placement of the portions of the given edge may be constrained so that the offset, if present, is retained. Alternatively or additionally, when the set of polygon parameters is revised, a total area of all of the polygons may be constrained to have a constant value.

In some embodiments, prior to determining the set of polygon parameters, the computer system generates the modified target pattern by performing one or more symmetry operations on at least a portion of the target pattern. For example, the symmetry operations may include: a rotation operation on one or more polygons in at least the portion of the target pattern, a reflection operation on the one or more polygons in at least the portion of the target pattern, and/or a translation operation on the one or more polygons in at least the portion of the target pattern.

In some embodiments, prior to evaluating the cost function, the computer system calculates a source pattern associated with the mask pattern.

Note that evaluating the cost function may involve determining the estimated target pattern, where determining the estimated target pattern involves a model of a photo-resist used during the photolithographic process. This cost function may be a metric of manufacturability of the modified target pattern, the mask pattern or both.

Furthermore, the difference between the modified target pattern and the estimated target pattern may be the maximum difference between the modified target pattern and in a set of estimated target patterns produced during photolithographic processes at one or more image planes using the mask pattern the object plane.

Another embodiment provides a method including at least some of the above-described operations performed by the computer system.

Another embodiment provides a computer-program product for use in conjunction with the computer system.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIG. 9 is a block diagram illustrating an image data structure in accordance with an embodiment of the present disclosure.

Note that like reference numerals refer to corresponding parts throughout the drawings. Moreover, multiple instances of the same part are designated by a common prefix separated from an instance number by a dash.

DETAILED DESCRIPTION

Figure 1:
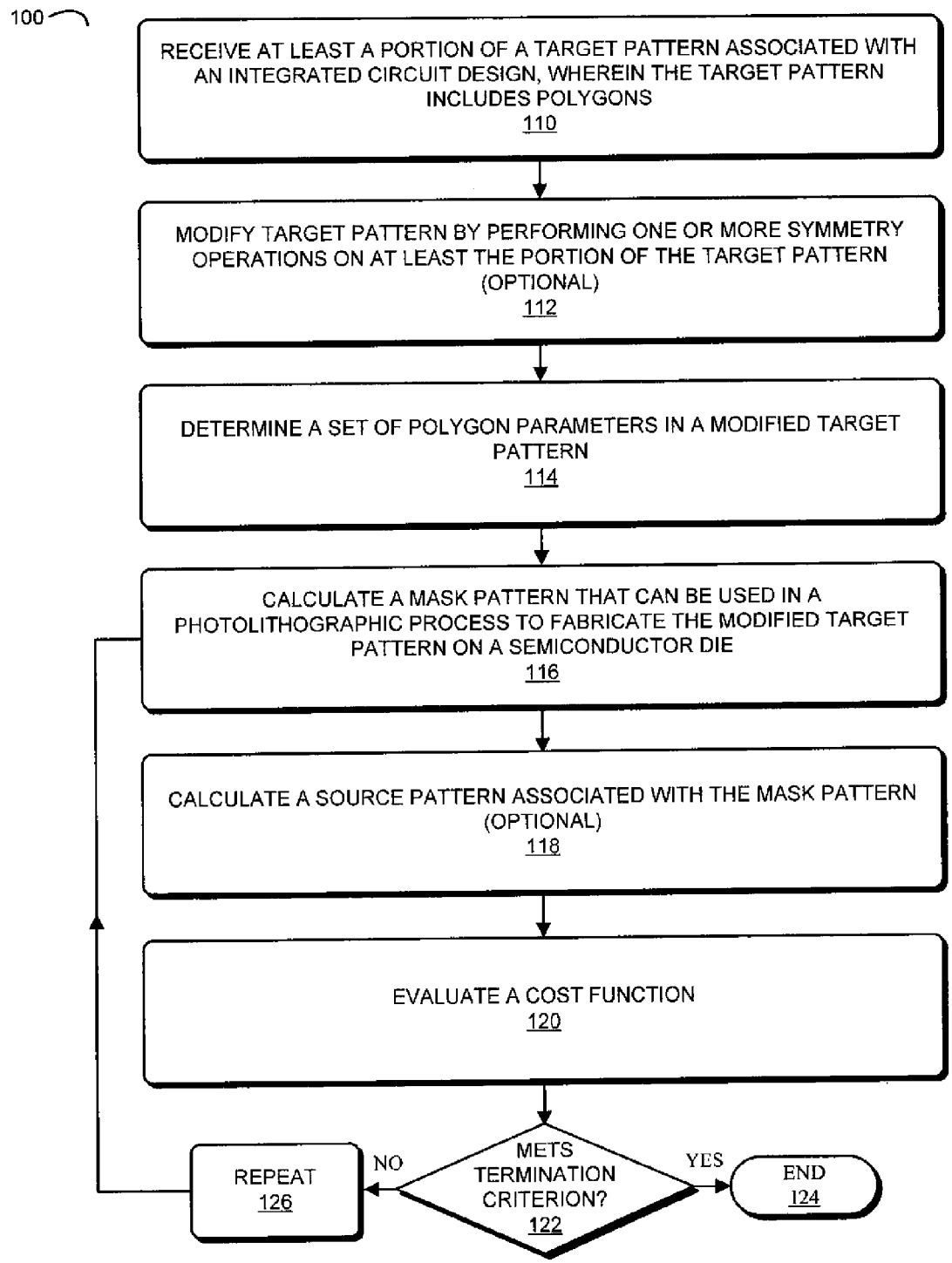
FIG. 1 is a flow chart illustrating a process for determining a modified target pattern associated with an integrated-circuit design in accordance with an embodiment of the present disclosure.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, and a computer-program product (i.e., software) for use with the computer system are described. These devices and processes may be used to modify at least a portion of a target pattern associated with an integrated-circuit design so that polygons in the target pattern, which represent features in the integrated-circuit design, result in acceptable accuracy during a photolithographic process that fabricates the target pattern on a semiconductor die. In particular, a set of polygon parameters associated with the polygons, which include polygon positions and areas of the polygons, are modified, as needed, so that a cost function that corresponds to a difference between a modified target pattern and an estimated target pattern produced during the photolithographic process meets a termination criterion. In this calculation, a mask pattern that can be used in the photolithographic process to fabricate the modified target pattern on the semiconductor die is calculated using an inverse optical calculation in which the modified target pattern is at an image plane of an optical path associated with the photolithographic process and the mask pattern is at an object plane of the optical path.

By modifying the target pattern, the calculation technique allows the size and shape of some or all of the polygons to be optimized to obtain a minimal cost function value based on process variation (such as the process-variation band), the process window, image contrast, the normalized image log-slope, and/or the depth of focus. This calculation technique may reduce defects and improve yield in the photolithographic process by determining an optimal polygon geometry. As a consequence, the calculation technique may reduce the costs of photo-masks, as well as wafers produced using the photolithographic process.

In the discussion that follows, a photo-mask should be understood to include: a chromium-on-glass photo-mask, an alternating phase-shifting photo-mask, an attenuating phase-shifting photo-mask, and/or multiple-exposure photo-masks (e.g., where patterns printed on a wafer or semiconductor die using two or more photo-masks are combined to produce a desired or target pattern, such as a portion of an integrated circuit). Furthermore, a mask pattern should be understood to include the pattern of spatially varying transmittance magnitude and/or transmittance phase in a given photo-mask. Note that, typically, the manufactured or fabricated mask pattern in a given photo-mask deviates from an ideal target mask pattern, for example, because of defects that can occur during the photo-mask fabrication process.

In addition, in the discussion that follows note that an image and/or a pattern may include a bitmap or grayscale file that includes a set of values corresponding to pixels in the image and/or the pattern. Furthermore, the quantization (i.e., the number of bits) in these files may be varied, as needed, during the measurements and calculations that are described. Alternative formats having the same or similar information content, including a vector-based format such as a Graphic Design System II (GDSII) and/or an OASIS format, may be used in some embodiments of the images and/or patterns. And in some embodiments, the images and/or patterns include real and imaginary components (or equivalently, magnitude and phase information).

We now describe embodiments of the calculation technique. FIG. 1 presents a flow chart illustrating a method 100 for determining a modified target pattern associated with an integrated-circuit design, which is performed by a computer system (such as computer system 800 in FIG. 8). (This method is sometimes referred to as a 'lithographically enhanced edge-determination calculation' or a 'LEED calculation.') During operation, the computer system receives at least a portion of a target pattern associated with the integrated-circuit design (operation 110), where the target pattern includes polygons that represent features in the integrated-circuit design.

Then, the computer system determines a set of polygon parameters in the modified target pattern (operation 114), where the set of polygon parameters include polygon positions in the modified target pattern and areas of the polygons. For example, the set of polygon parameters may include placement of edges in each of the polygons, where placement of a given edge in a given polygon is along a direction perpendicular to the given edge. In some embodiments, the given edge may be subdivided into portions of the given edge that may be independently positioned so that they may be offset along the direction from each other.

Moreover, the computer system calculates a mask pattern that can be used in a photolithographic process to fabricate the modified target pattern on a semiconductor die (operation 116), where the mask pattern is calculated using an inverse optical calculation in which the modified target pattern is at an image plane of an optical path associated with the photolithographic process and the mask pattern is at an object plane of the optical path. Note that, prior to calculating the mask pattern (operation 116), the polygons may have the same area.

Next, the computer system evaluates a cost function (operation 120) to determine if a termination criterion is met (operation 122), where the cost function corresponds to a difference between the modified target pattern and an estimated target pattern produced during the photolithographic process at the image plane using the mask pattern at the object plane. Note that evaluating the cost function may involve determining the estimated target pattern, where determining the estimated target pattern involves a model of a photo-resist used during the photolithographic process. This cost function may be a metric of manufacturability of the modified target pattern, the mask pattern or both. Furthermore, the difference between the modified target pattern and the estimated target pattern may be the maximum difference between the modified target pattern and in a set of estimated target patterns produced during photolithographic processes at one or more image planes using the mask pattern the object plane.

If the termination criterion is met, method 100 ends (operation 124). Otherwise, if the termination criterion is not met, the computer system revises the set of polygon parameters by repeating (operation 126) the calculation of the mask pattern and the evaluating of the cost function until the termination criterion is met. When the set of polygon parameters is revised, the placement of the portions of the given edge may be constrained so that the offset, if present, is retained. Alternatively or additionally, when the set of polygon parameters is revised, a total area of all of the polygons may be constrained to have a constant value. In some embodiments, there are constraints in the LEED calculation on particular polygons or particular edges. For example, 's' shaped polygons may not be removed into simple rectangular polygons.

In some embodiments, prior to determining the set of polygon parameters (operation 114), the computer system optionally generates the modified target pattern by performing one or more symmetry operations on at least a portion of the target pattern (operation 112). For example, the symmetry operations may include: a rotation operation on one or more polygons in at least the portion of the target pattern, a reflection operation on the one or more polygons in at least the portion of the target pattern, and/or a translation operation on the one or more polygons in at least the portion of the target pattern.

By performing the symmetry operations, the computer system can determine if at least the portion of the target pattern corresponds to a minimum unit cell in a work unit in the integrated-circuit design has rotation and/or reflection (flip) symmetry. (Note that the integrated-circuit design may be divided into multiple work units, which can include multiple unit cells. As described further below with reference to FIG. 7, at least some of these work units may be analyzed in parallel to determine the modified target pattern and/or a corresponding mask pattern.) If at least the portion of the target pattern does not have rotation and/or reflection symmetry, boundaries of at least the portion of the target pattern may be changed so that the modified target pattern has rotation and/or reflection (flip) symmetry. While not required for the LEED calculation, having a unit cell with such symmetry may be useful if the target design (such as that for dynamic random access memory or static random access memory) has rotation or reflection symmetry, because it may allow the results of analysis of a single unit cell or work unit to be reused at multiple locations in the target pattern. Note that minimum unit cell may include 10 polygons and/or may have an area of $100 \times 100$ nm$^2$ (or, more generally, less than 1 µm$^2$).

In some embodiments, prior to evaluating the cost function (operation 120), the computer system optionally calculates a source pattern associated with the mask pattern (operation 118). For example, the source pattern may be one of a pre-defined group of source patterns (such as annular, quadrapole, etc.), an arbitrary source pattern and/or a pixilated source pattern. Thus, the computer system may jointly or separately optimize the mask pattern and/or the source pattern used in the photolithographic process.

In some embodiments of method 100 there may be additional or fewer operations. For example, modification or adjustment of the target pattern may be used in conjunction with the design of: the mask pattern, the source pattern and/or the photo-resist (thus, in principle, there may be up to four degrees of freedom in the overall design process.) Moreover, the order of the operations may be changed, and/or two or more operations may be combined into a single operation.

Figure 2:
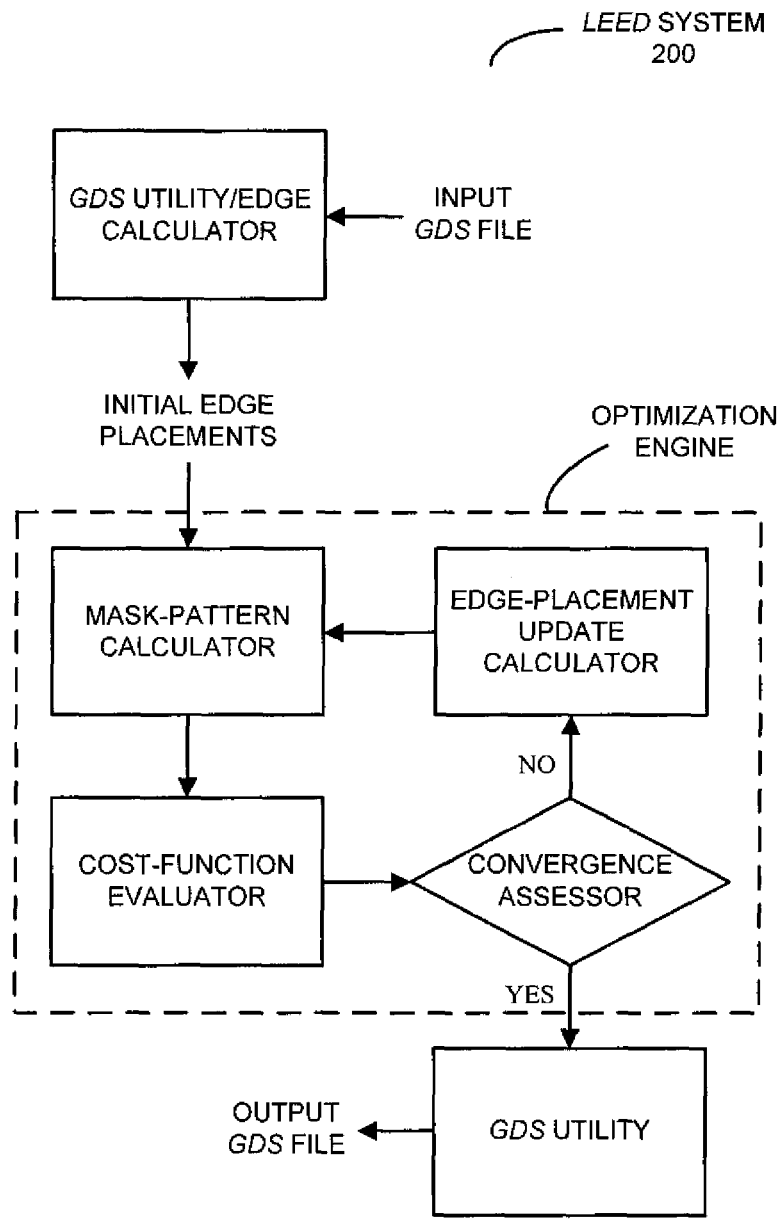
FIG. 2 is a block diagram illustrating a Lithographically Enhanced Edge-Determination (LEED) system in accordance with an embodiment of the present disclosure.

FIG. 2 presents a block diagram illustrating a LEED system 200. This LEED system may be used to iteratively refine positions of polygons in a target pattern or design by determining a mask pattern using an inverse optical calculation and calculating values of a cost function. LEED system 200 includes a computational geometry calculator (which includes polygon utilities, such as a GDS utility), and an inverse-optical calculator that evaluates the cost function in a linearly constrained optimization engine. Using LEED system 200, parameters in the set of polygon parameters can be modified and/or optimized, including: the global bias, polygon shifts, polygon areas, and/or polygon edge positions (i.e., individual edge movement). As noted previously, and described further below with reference to FIG. 4, in some embodiments a mask pattern used during the LEED calculation is determined using an inverse optical calculation based on information about the optical path associated with the photolithographic process.

In some embodiments, the cost function for the LEED calculation may have its maximum value (i.e., it may be worst) at one or more image planes in the photolithographic process over a range of process variation in parameters associated with the photolithographic process. For example, the range of process variation in the parameters may include: focus variations (such as those associated with immersion optics, a disk illumination with a sigma of 0.75, a numerical aperture of 0.67, a wavelength of 193 nm, a critical dimension of 28 nm, etc.), dose variations, and/or mask-bias. Furthermore, in some embodiments different weights are used for different types of topological features in the target pattern (such as corners, straight regions, line ends, t-shaped intersections, etc.) when determining the cost function.

Figure 3A:
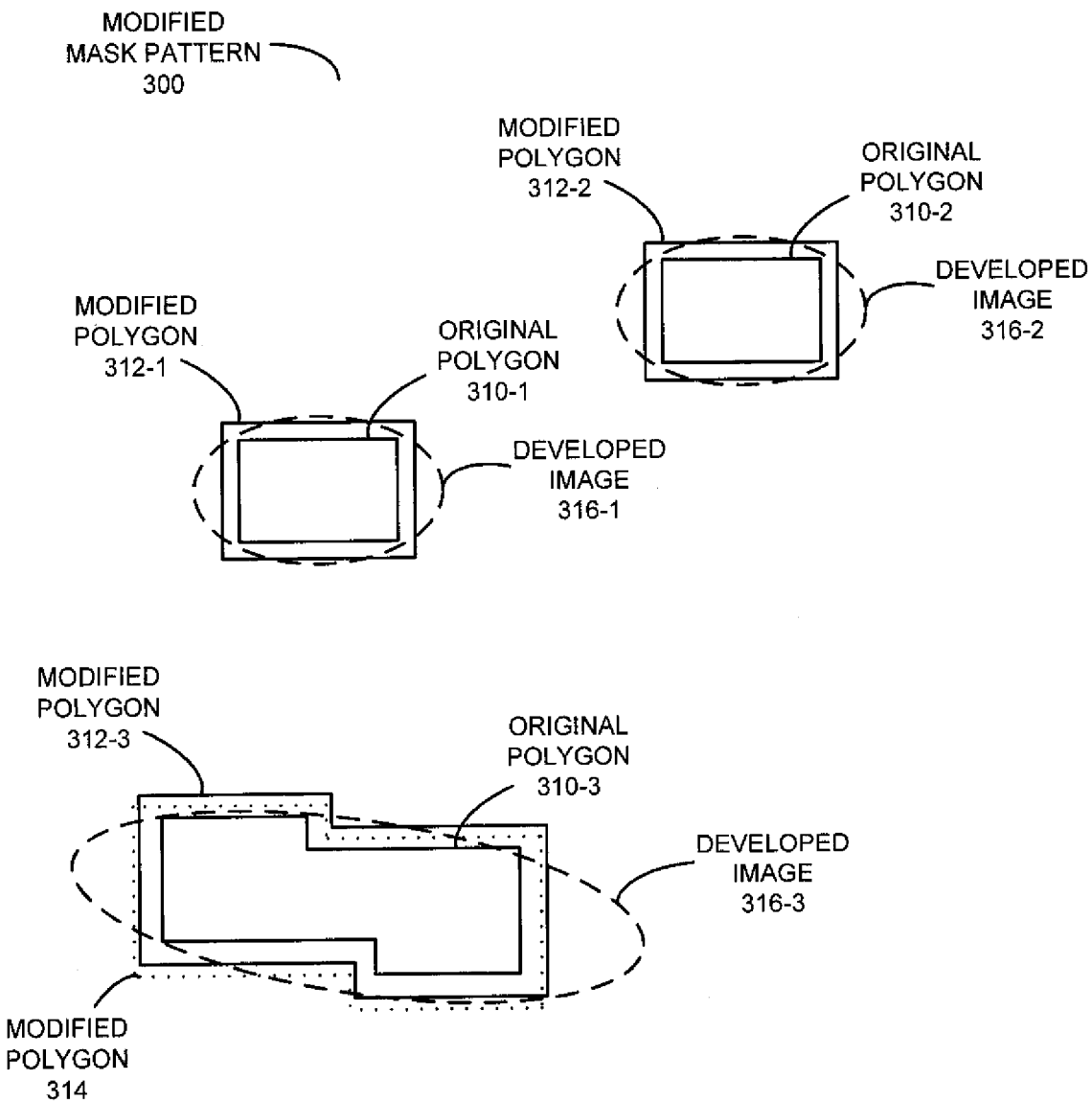
FIG. 3A is a block diagram illustrating determination of a modified target pattern using LEED in accordance with an embodiment of the present disclosure.

FIG. 3A presents a block diagram illustrating determination of a modified target pattern 300 using LEED. In this example, global bias (i.e., a positive or negative movement that is applied to all edges) of original polygons 310 is first determined. Then, polygon shifts (if any) of the resulting modified polygons 312 are determined. This results in modified polygon 314. Note that modified polygons 312-1, 312-2, and 314 produce developed images 316 at an image plane of the photolithographic process. By modifying the target pattern, the corresponding maximum value of the cost function (over the range of process variation, such as 20-30% in bias and mask-size, and a few percent in edge placement) can be reduced (i.e., improved). For example, the initial maximum value of the cost function may be 33.85. After global bias, this may be reduced to 7.02, and after polygon shift it may be reduced to 6.73.

Figure 3B:
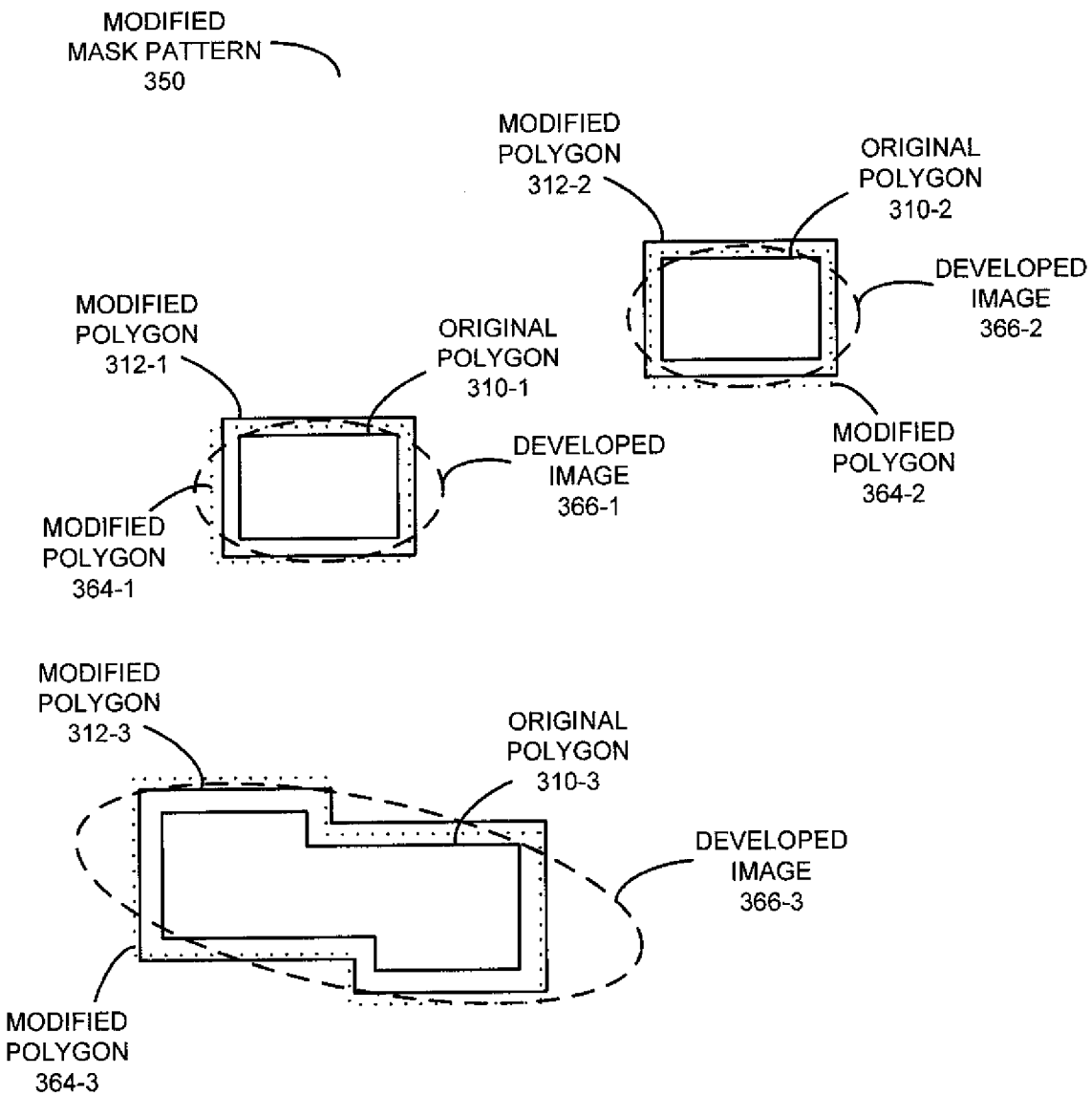
FIG. 3B is a block diagram illustrating determination of a modified target pattern using LEED in accordance with an embodiment of the present disclosure.

FIG. 3B presents a block diagram illustrating determination of a modified target pattern 350 using LEED. In this example, global bias of original polygons 310 is first determined. Then, individual edges in modified polygons 312 are moved. This results in modified polygons 364. Note that modified polygons 364 produce developed images 366 at an image plane of the photolithographic process. By modifying the target pattern, the corresponding maximum value of the cost function (over the range of process variation) can be reduced. For example, the initial maximum value of the cost function may be 33.85. After global bias, this may be reduced to 7.02, and after individual edge movement it may be reduced to 5.88.

Figure 4:
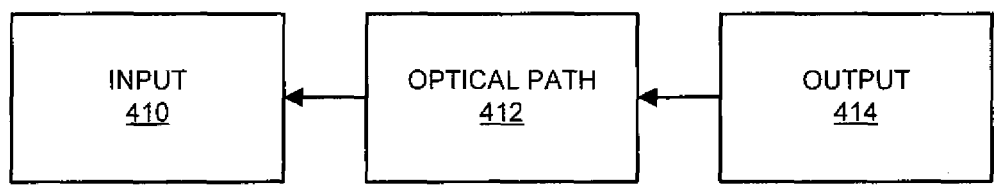
FIG. 4 is a block diagram illustrating an inverse optical calculation in accordance with an embodiment of the present disclosure.

We now describe optical calculations that may be used during LEED. FIG. 4 presents a block diagram illustrating an inverse optical calculation 400, which may be used to calculate a mask pattern based on the modified target pattern. In this calculation, a predicted input 410 (such as a predicted pattern or an image) at an object plane of optical path 412 is determined based on an output 414 (such as a pattern or an image) at an image plane of optical path 412. For example, the mask pattern at the object plane may be determined based on the desired target pattern or the modified target pattern, as well as using information about the optical path in the photolithographic process. In some embodiments, this inverse optical calculation is also based on a target mask pattern at the object plane. Note that information about optical path 412 may include illumination and/or optical effects.

While the preceding discussion illustrates the inverse optical calculation using a single output 414, in other embodiments two or more patterns at image plane(s) of optical path 412 may be used. For example, instead of a target pattern or a modified target pattern, there may be a set of images corresponding to the target pattern or the modified target pattern that are each determined using different focal conditions (e.g., on different focal surfaces or planes). In some embodiments, the difference of two patterns at image plane(s) may be used in the inverse optical calculation 400. Furthermore, in some embodiments each of the patterns at the image plane(s) used in the inverse optical calculation 400 or a term(s) including some combination of the patterns at the image plane(s) may be multiplied by a corresponding weight. In this way, inverse optical calculation 400 may emphasize one or more of the patterns at an image plane relative to other patterns (at the same or other image planes) used in inverse optical calculation 400.

Figure 5:
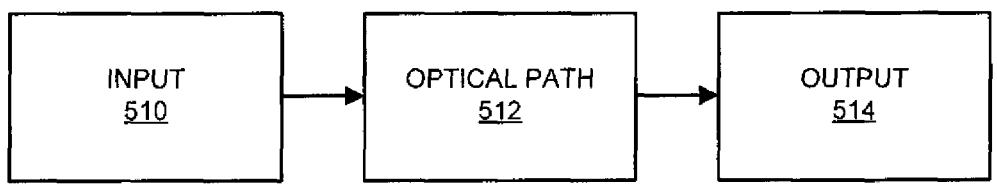
FIG. 5 is a block diagram illustrating a forward optical calculation in accordance with an embodiment of the present disclosure.

In some embodiments, inverse optical calculation 400 is based on iterative minimization of an error function (H), which is also sometimes referred to as a 'cost function' or a 'Hamiltonian function.' In particular, during each iteration of inverse optical calculation 400 the error function may be a function of the difference between output 414 and a pattern (or image) that results when input 410 is projected through optical path 412 (such as in a forward optical calculation, which is described below with reference to FIG. 5). In some embodiments, input 410 initially corresponds to the target mask pattern, and as the calculation progresses this pattern is allowed to evolve while output 414 is held constant. In general, in embodiments with multiple patterns (or images) at object plane(s) and/or image plane(s), the error function (H) equals $$\sum_{j=1}^{N} w_j |I_j - I_{oj}|^n,$$

where $I_j$ is the forward projection of the jth pattern at the object plane (out of N patterns in this example) through optical path 412, $w_j$ is a corresponding weight, $I_{oj}$ is the jth pattern at an image plane, and n is a power. Note that the error function (H) approaches zero as $I_j$ approaches $I_{oj}$. In an exemplary embodiment of the LEED calculation, N is 1 and n is 2.

In some embodiments, the weights are varied as inverse optical calculation 400 progresses and/or different weights are used for specific parts (or even pixels) of a pattern. For example, the weights may be determined based on the difference between $I_j$ and $I_{oj}$ at a given step in inverse optical calculation 400. This approach may exaggerate the features or defects, especially when inverse optical calculation 400 is close to a local or global minimum and the error function (H) corresponds to small differences. Thus, in general the error function (H) may be expressed as a double integral over the pattern or image area and there may be separate time-dependent weights for $I_j$ and $I_{oj}$. Furthermore, in some embodiments the error function (H) is expressed as a relative difference between $I_j$ and $I_{oj}$ for at least a portion of inverse optical calculation 400 as it progresses.

While the preceding example illustrated optimization by gradient flow, in other embodiments the LEED calculation uses Bound Optimization BY Quadratic Approximation (BOBYQA). Furthermore, the LEED calculation may use a cost function that is based on: process variation (such as the process-variation band), the process window, image contrast, the normalized image log-slope, and/or the depth of focus. For example, inverse optical calculation 400 may be used to move polygon segments within constrains (such as constraints based on symmetry, design rules, etc.) to optimize the cost function. In this discrete optimization technique, the polygons may be moved. Then, inverse optical calculation 400 may be performed. Moreover, the process-variation bands may be computed for wafer images. Next, an improved polygon solution may be selected and the process may be iterated until a convergence criterion (such as a desired process-variation tolerance) is achieved.

It will be recognized by one of ordinary skill in the art that inverse optical calculation 400 described above is poorly defined. In particular, numerous possible patterns at the object plane may result from the same observed output 414. Therefore, input 410 may be selected such that it is 'most likely' to represent the target mask pattern. A variety of constraints and additional criteria may be imposed when determining the solution(s) to this problem in order to find a unique answer(s). For example, input 410 may be that which has the smallest value of the error function (H).

FIG. 5 presents a block diagram illustrating a forward optical calculation 500. In this calculation, a suitable illuminated input 510 (such as a pattern or an image) at an object plane of optical path 512 is used to determine a predicted output 514 (such as a pattern or an image) at an image plane of optical path 512. For example, using the determined mask pattern, a source pattern, and information about the optical path associated with the photolithographic process, the resulting wafer pattern can be determined. (As noted previously, the difference(s) between the wafer pattern, i.e., the estimated target pattern, and the target pattern can be used to determine the cost function.) Note that optical path 512 may be different than optical path 412 (FIG. 4). In general, information about optical path 512 may include some or all of the aspects of the photolithographic process, such as illumination settings, the electromagnetics of the photo-mask, the exposure-tool optics, etc. In addition, in some embodiments forward optical calculation 500 models the effect of a photoresist, including flare and/or etch effects.

Note that calculations corresponding to one or more optical paths in inverse optical calculation 400 (FIG. 4) and/or forward optical calculation 500 may be implemented using Fourier-optical techniques. Furthermore, the optical paths in inverse optical calculation 400 (FIG. 4) and/or forward optical calculation 500 may include multiple models of optical paths (such as when there are different exposure tools used in multi-exposure photolithography). Also note that while optical path 412 (FIG. 4) and optical path 512 have been traversed in particular directions, each of these optical paths may be traversed in either direction.

We now describe an exemplary embodiment of the forward optical calculation or forward projection operation used to calculate the estimated target pattern. For simplicity, coherent illumination of the photo-mask (which corresponds to the mask pattern) is utilized. Furthermore, the electric field falling upon the photo-mask is approximately constant. Thus, the clear regions of the photo-mask pass the light, while the opaque regions block the light. It follows that a scalar electric field E, just behind the photo-mask, may be expressed as $$E(\vec{r}) = \begin{Bmatrix} 0 & \text{chrome} \\ 1 & \text{glass} \end{Bmatrix},$$

where $\vec{r} = (x, y)$ is a point on the (x,y) plane. As discussed below with reference to FIG. 6, this representation of the photo-mask may be re-expressed using a function $\phi$ (referred to as a level-set function) having positive regions that indicate glass and negative regions that indicate chrome. Furthermore, the level-set function may equal zero at the boundaries or contours of the photo-mask. Therefore, the electric field E associated with the photo-mask may be re-expressed as a function of this level-set function, i.e., $$E(\vec{r}) = \hat{h}(\phi(x,y)),$$

where $\hat{h}$ is the Heaviside function $$\hat{h}(x) = \begin{Bmatrix} 1 & x \geq 0 \\ 0 & x < 0 \end{Bmatrix}.$$

Since an ideal diffraction limited lens acts as a low-pass filter, this may be used as an approximation to the actual (almost but not quite perfect) lens in the optical path in the photolithographic process (in this example). Mathematically, the action of the lens may be expressed as $$A(\vec{r}) = f^{-1}(\hat{C} \quad (f(E(\vec{r})))).$$

where $A(\vec{r})$ indicates the electric field distribution on the wafer, f indicates the Fourier transform, $f^{-1}$ indicates the inverse Fourier transform, and $\hat{C}$ indicates the pupil cutoff function, which is zero for frequencies larger than a threshold determined by the numerical aperture of the lens, and one otherwise. Thus, the pupil function is $$\hat{C}(k_x, k_y) = \hat{h}(k_{max}^2 - [k_x^2 + k_y^2]) = \begin{Bmatrix} 0 & k_x^2 + k_y^2 \geq k_{max}^2 \\ 1 & k_x^2 + k_y^2 < k_{max}^2 \end{Bmatrix},$$

wherein $k_x$, $k_y$ and $k_{max}$ represent frequency coordinates in Fourier space. Therefore, the estimated target pattern in inverse-optical calculator 214 (FIG. 2) is simply the square of the electric field $$I(\vec{r}) = |A(\vec{r})|^2.$$

Combining these two equations, we find $$F(\phi(x,y)) = (|f^{-1}(\hat{C} \quad (f(\hat{h}(\phi(x,y)))))|^2).$$

This is a self-contained formula for the estimated target pattern determined by LEED system 200 (FIG. 2).

Note that this is just one embodiment of the forward projector that can be used within the scope of this disclosure, chosen by way of example due to its relative simplicity. More sophisticated forward models also fall within the scope of the present disclosure. Such models may take into account, by way of example but not limitation, various illumination conditions (e.g., off-axis, incoherent), the actual electromagnetics of the light field interacting with the photo-mask, various types of photo-masks other than chrome on glass (e.g., attenuated phase shifting, strong phase shifting, other materials, etc.), the polarization of the light field, the actual properties of the lens (such as aberrations), and/or the vector nature of the electromagnetic field as it propagates through the optical path.

Figure 6:
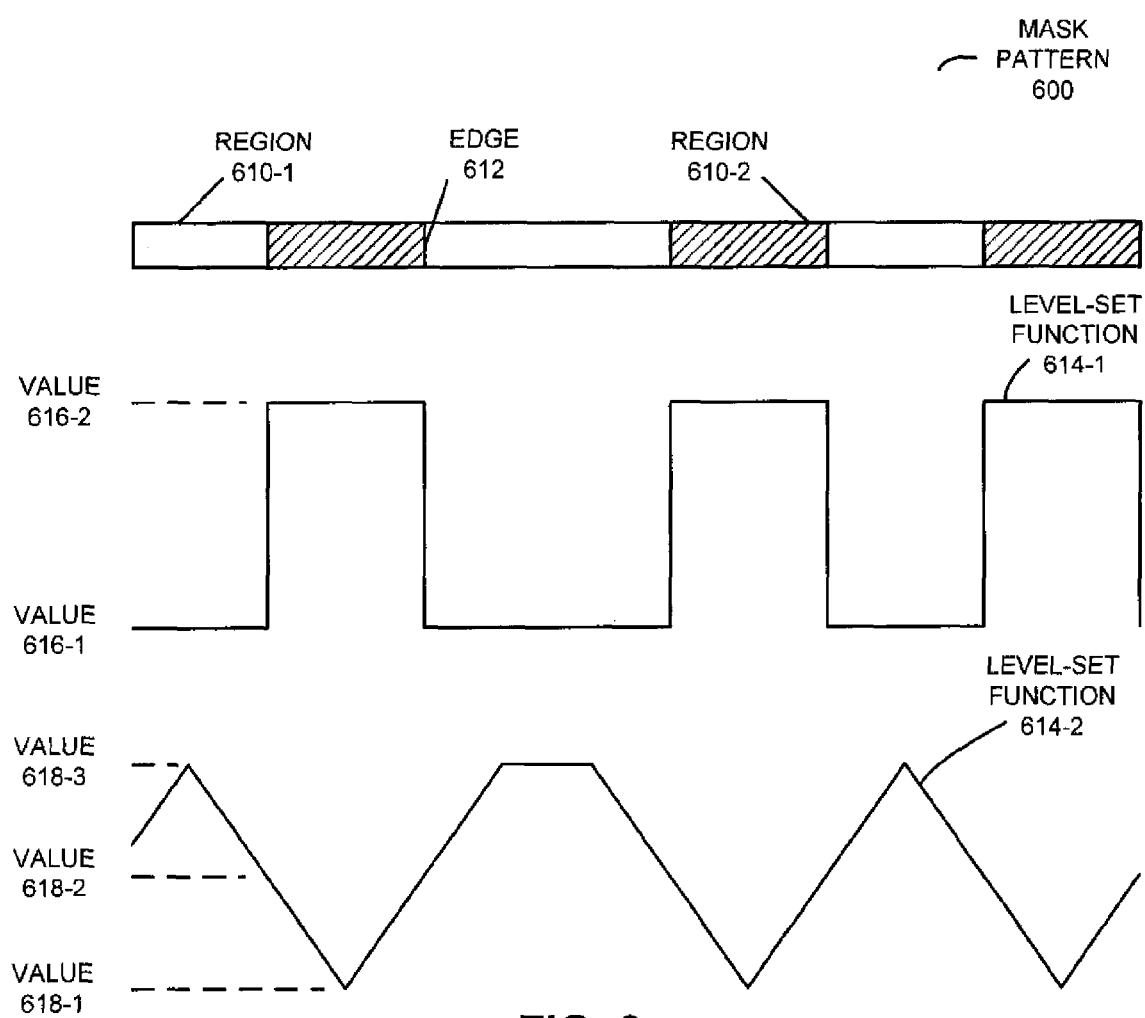
FIG. 6 is a block diagram illustrating a mask pattern and corresponding level-set functions in accordance with an embodiment of the present disclosure.

We now describe the level-set functions in more detail. As noted previously, the mask pattern corresponding to the modified target pattern, which is determined in inverse optical calculation 400 (FIG. 4), may be represented as a function having a set of values that is larger than those in the actual photo-mask. In some embodiments, the function is a level-set function. This is illustrated in FIG. 6, which provides a mask pattern 600 and corresponding level-set functions 614. This mask pattern includes alternating regions with glass (610-1) and chromium (610-2). Transitions from one region to another are characterized by a contour or an edge, such as edge 612. When viewed from a direction perpendicular to a plane of the photo-mask, edge 612 defines mask pattern 600.

Level-set function 614-1 has two values 616. Furthermore, edge 612 may correspond to a mid-point between these two values 616. In contrast, level-set function 614-2 has three values 618, and edge 612 may correspond to value 618-2. While not illustrated in FIG. 6, level-set functions 614 extend into the plane of FIG. 6 (e.g., they may be 3-dimension functions). As is known to one of skill in the art, there are many alternate level-set functions and/or configurations that may be used. For example, in some embodiments one or more separate level-set functions and/or separate patterns or images may be used for the features or defects.

As illustrated by level-set function 614-2, in some embodiments the level-set function may be expressed as a signed distance function relative to the contour or edge 612 (e.g., the value of the level-set function in at least a region is a function of the distance from the edge 612). This formulation may allow effects that occur nearer to the edge 612 to be highlighted. However, because features in photo-masks may occur at random locations (including those far removed from edge 612), level-set function 614-1 may be useful in that it provides an equal weighting with respect to edge 612.

In some embodiments, during each iteration of inverse optical calculation 400 (FIG. 4) the level-set function corresponding to input 410 (FIG. 4) being modified is updated according to $$\phi_{i+1} = \phi_i + \Delta t \cdot \nabla(H),$$

where $\phi_{i+1}$ is an updated version of the level-set function, $\phi_i$ is the current version of the level-set function, $\Delta t$ is a step size in the calculation and $\nabla(H)$ is a gradient or a derivative of the error function. In an exemplary embodiment, $\nabla(H)$ is $$\left.\frac{\delta H}{\delta \phi}\right|_{\phi_i},$$

i.e., it is the Frechet derivative of the error function H. Furthermore, in some embodiments $\nabla(H)$ is the direction of steepest descent for minimizing or optimizing H by changing $\phi$. Furthermore, in some embodiments a $1^{st}$ order and/or a $3^{rd}$ order Runge-Kutta method is used when updating $\phi_i$. In other embodiments, a Conjugate Gradient technique, a Levenberg-Marquardt technique, a Quasi-Newton technique, and/or a Simplex technique may be used.

At least some aspects of Simulated Annealing may be utilized in some embodiments of inverse optical calculation 400 (FIG. 4). In particular, the error function H may be allowed to increase during some steps as the calculation evolves. In this way, the global minimum in the multi-dimensional space may be determined. Note that the size of this multi-dimensional space may be a number of quantization levels to the power of the number of pixels in the determined mask pattern. In an exemplary embodiment, the pattern or image has at least 1 million pixels (for example, 1024×1024).

In one embodiment, in any iteration of inverse optical calculation 400 (FIG. 4), changes in $\phi$ that decrease or increase the error function (H) up to 0.5% are performed. If a larger change will result (e.g., $\Delta H > 0.5\%$), the step size $\Delta t$ may be decreased by a factor that is at least greater than 1 and the change in $\phi$ is implemented (or not) based on a probability and a value P given by $$e^{\frac{-kH_{i+1}}{H_i}},$$

where $H_{i+1}$ is the error function in the i+1$^{th}$ iteration (if the change in $\phi$ is implemented) and $H_i$ is the error function in i$^{th}$ iteration (note that the ratio of $H_{i+1}/H_i$ equals $1+\Delta H$). In some embodiments k is 0.155. For example, if the value P is 0.3 and the probability is a random (or pseudorandom) number between 0 and 1 that is less than P, the error function may be increased before proceeding. In this way, inverse optical calculation 400 (FIG. 4) initially takes large steps and thereby explores the solution space.

In some embodiments, inverse optical calculation 400 (FIG. 4) is run for 100, 1000 or 10,000 iterations at which point the optimal solution has been determined. In other embodiments, the calculation is stopped based on convergence criteria, such as oscillatory behavior, a relative and/or absolute difference between the estimated target pattern and the modified target pattern, the latest change to the error function H, and/or the history of changes to the error function H. For example, the relative difference may be less than 1% and/or the absolute difference may be 10 nm for a critical dimension of 100 nm. Note that is some embodiments, the level-set function is re-distanced (i.e., restored to one having the distance function property relative to the edge 612) at intermediate iterations during inverse optical calculation 400 (FIG. 4). In an exemplary embodiment, such re-distancing occurs at least every 20 iterations (for example, every 14 iterations).

Using this inverse calculation approach, features smaller than the wavelength of the light source used to print wafer patterns in the photolithographic process may be determined. For example, in simulations using a light source having a wavelength of 260 nm, features as small as $(40 \text{ nm})^2$ were determined.

Furthermore, in some embodiments, the LEED calculation and/or inverse optical calculation 400 (FIG. 4) are divided into a series of overlapping sub-problems (also referred to as 'work units') at least some of which are processed independently and/or concurrently. These work units may be based on elements or structures (for example, repetitive structures) in the mask pattern and/or the target pattern. In some embodiments the work units may partially overlap neighboring work units. For example, the work units may be between 10,000 nm$^2$ and 100 μm$^2$ in size.

Note that unresolved mismatches between independently processed work units can result in failures when attempting to manufacture the determined mask pattern and/or can adversely impact photolithographic quality. In some embodiments, this problem is addressed by iteratively reprocessing interacting regions within a static, or partially static, environment to resolve conflicts. Analysis of the interacting regions is considered complete when the interacting regions have been fully reprocessed in a completely static environment, within a specified interaction distance.

In general, work units are processed independently to obtain a desired solution within the core region of the work units, which is usually defined as some distance inside the work unit from the work-unit boundary (such as a 10% offset from the work-unit boundary). Thus, each of the work units may be processed during calculations along with environment data, such as a 'halo' that includes data from neighboring work units. During the processing, the halo data may be dynamic, in the sense that the solutions within the halos may be allowed to change. However, because each of the work units may be processed independently, the environment solution in the halo of a given work unit may differ from the solution for that region when it is processed in another work unit. This variation may result in a mismatch of the results or solutions provided by independently processed work units.

As a consequence, processing the work units to get a solution for the core regions often requires updating the dynamic environment from neighboring work units during the calculations in order to obtain an optimal solution. In particular, after processing to get results in the core regions, a series of iterative passes may be performed to isolate and fix any boundary issues. In the general case, where the work units are much larger than overlapping halos (which define an interaction distance), two passes may be sufficient to resolve mismatches at the work-unit boundaries.

Figure 7:
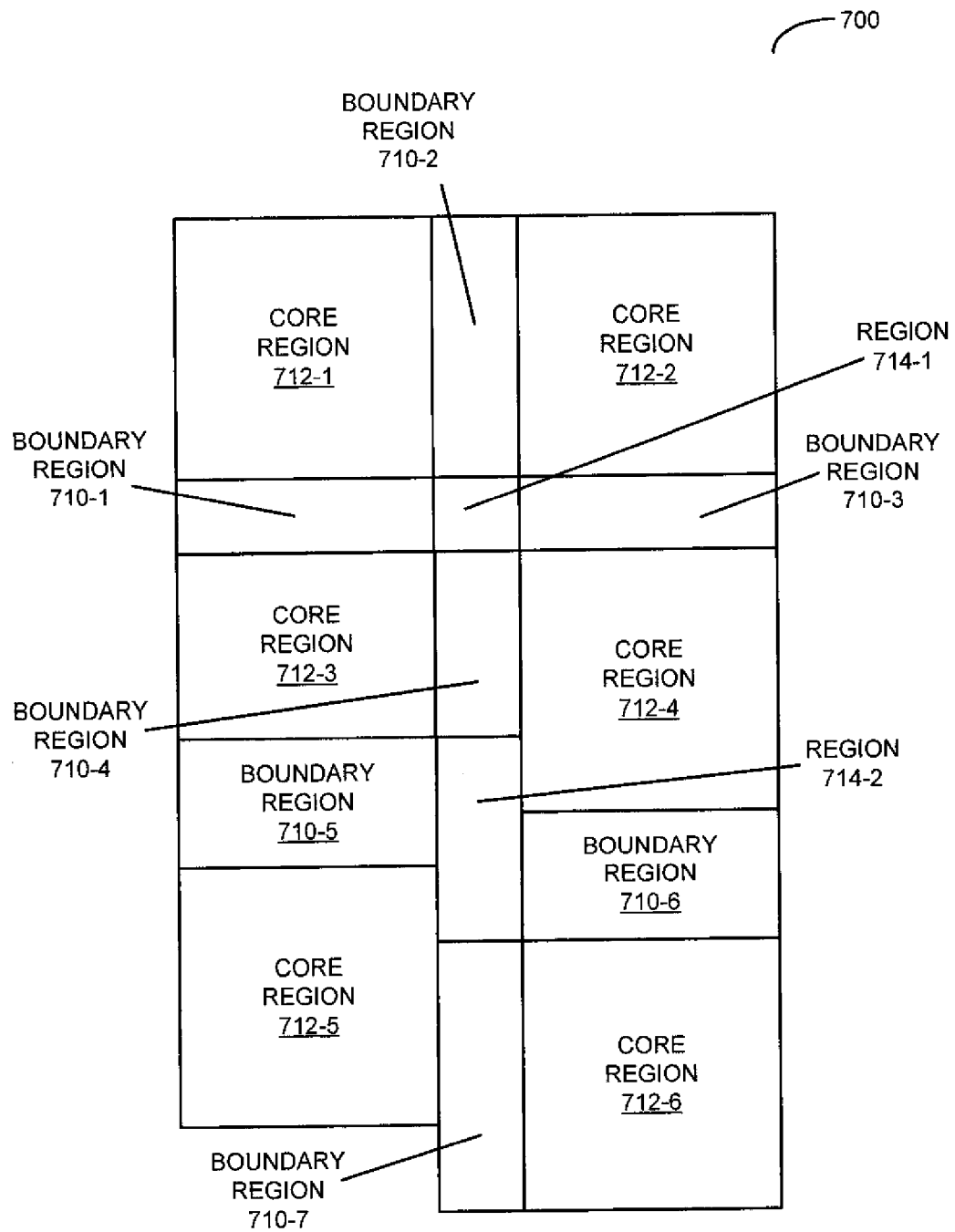
FIG. 7 is a block diagram illustrating the iterative processing of work units in accordance with an embodiment of the present disclosure.

For example, as shown in FIG. 7, which presents a block diagram 700 illustrating the iterative processing of work units, a first pass may process any single adjacency boundary regions 710, while holding core regions 712 static. In this first pass, regions 714 are not processed. Then, in the second pass, any multiple-adjacency regions (such as regions 714) are processed, while regions 710 and 712 are held static. In this way, regions 714 are isolated by a full interaction radius from any other multiple-adjacency regions (i.e., they are surrounded by regions that are held static). These regions are not modified in the halo of the processed regions, and the solution within the processed work units will take into account the static environment while generating a solution.

Note that this approach can be applied to a range of problems because the framework has little knowledge about what is being processed within the work areas during the boundary processing. The main inputs are the interaction radius (which is used to find a valid solution without interaction from the neighboring work areas) and the reprocessing distance (which is the distance from the work-unit boundary where changes can be made to fix the boundary solution).

In some embodiments, in order to process groups of small work units whose interaction regions cannot be reprocessed in two passes, a three-pass flow is used. In these cases, the work units encompassing these interaction regions may be partitioned and reprocessed in three passes by creating new work units within the boundary of the original work units from the first pass. As in the preceding two-pass example, in the final (third) pass, isolated work areas, which are surrounded by static regions, are processed.

Figure 8:
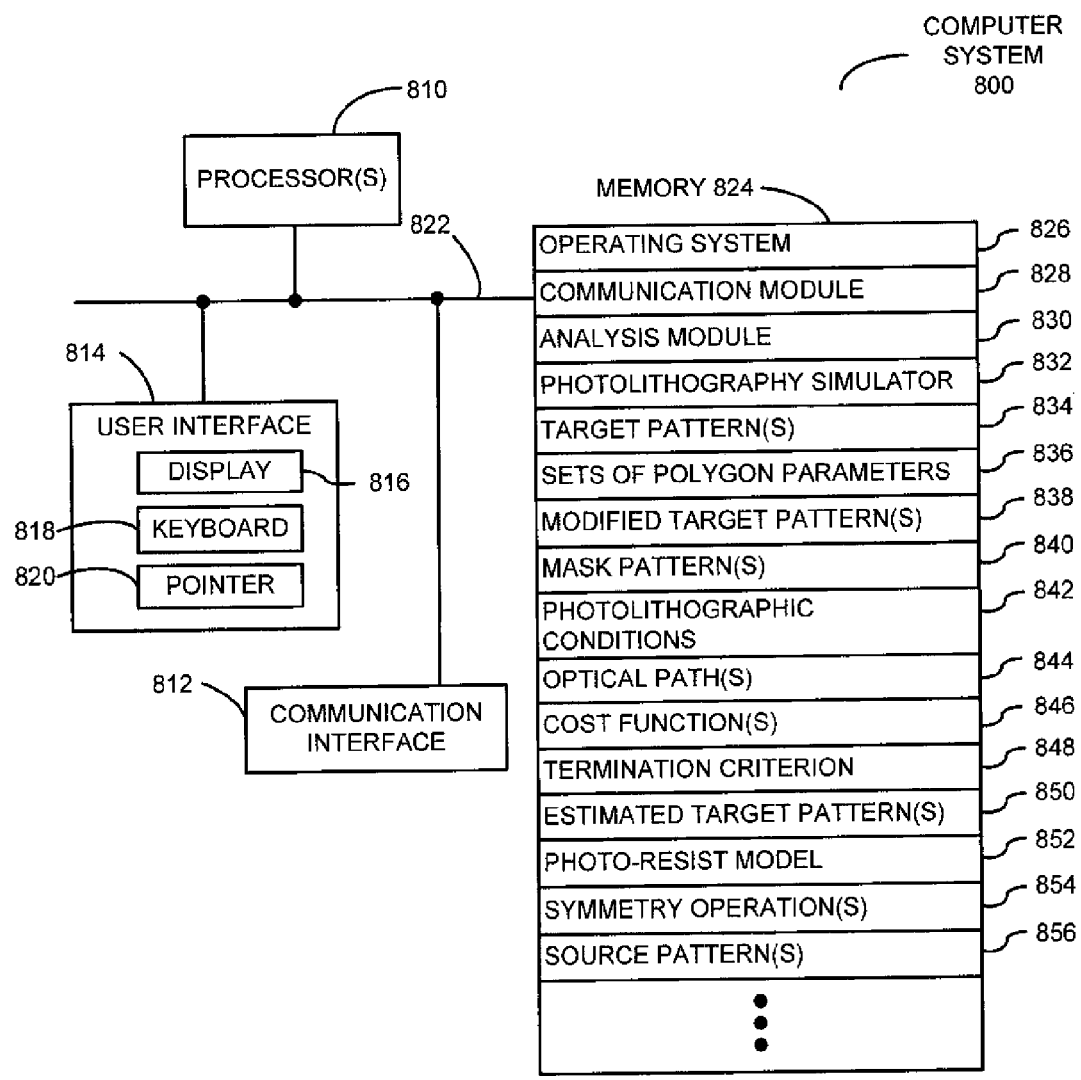
FIG. 8 is a block diagram illustrating a computer system in accordance with an embodiment of the present disclosure.

We now discuss computer systems for implementing the calculation technique. FIG. 8 presents a block diagram illustrating a computer system 800. Computer system 800 includes one or more processors 810, a communication interface 812, a user interface 814, and one or more signal lines 822 coupling these components together. Note that the one or more processing units 810 may support parallel processing and/or multi-threaded operation, the communication interface 812 may have a persistent communication connection, and the one or more signal lines 822 may constitute a communication bus. Moreover, the user interface 814 may include a display 816, a keyboard 818, and/or a pointer 820, such as a mouse.

Memory 824 in the computer system 800 may include volatile memory and/or non-volatile memory. More specifically, memory 824 may include ROM, RAM, EPROM, EEPROM, flash, one or more smart cards, one or more magnetic disc storage devices, and/or one or more optical storage devices. Memory 824 may store an operating system 826 that includes procedures (or a set of instructions) for handling various basic system services for performing hardware dependent tasks. The memory 824 may also store procedures (or a set of instructions) in a communication module 828. The communication procedures may be used for communicating with one or more computers and/or servers, including computers and/or servers that are remotely located with respect to the computer system 800.

Memory 824 may also include multiple program modules (or a set of instructions), including: analysis module 830 (or a set of instructions), and/or photolithography simulator 832 (or a set of instructions). Note that one or more of these program modules (or sets of instructions) may constitute a computer-program mechanism. Furthermore, note that one or more of these program modules (or sets of instructions) may be implemented as a stand-alone software application, or as a program module or subroutine in another application.

During operation, computer system 800 may receive one or more target patterns 834 (which include polygons) associated with an integrated-circuit design. Then, analysis module 830 may determine one or more sets of polygon parameters 836 in one or more modified target patterns 838. FIG. 9 presents a block diagram illustrating a data structure 900. This data structure may include sets of polygon parameters 910 for different integrated-circuit designs. For example, for a given set of polygon parameters, such as set of polygon parameters 910-1, data structure 900 may include: integrated-circuit design 912-1, global bias 914-1, polygon shifts 916-1, individual edge movements 918-1, polygon areas 920-1, and/or cost-function values 922-1.

Referring back to FIG. 8, photolithography simulator 832 may subsequently calculate one or more mask patterns 840 that can be used in a photolithographic process (having associated photolithographic conditions 842) to fabricate the one or more modified target pattern 838 on a semiconductor die, where the one or more mask patterns 840 are calculated using an inverse optical calculation in which a given one of the one or more modified target patterns 838 is at an image plane of one of one or more optical paths 844 associated with the photolithographic process and the one or more mask patterns 840 are at an object plane of one of the or more optical paths 844. Next, analysis module 830 evaluates one or more cost functions 846 to determine if a termination criterion 848 is met, where a given one of the one or more cost functions 846 corresponds to a difference between the one or more modified target patterns 838 and one or more estimated target patterns 850 produced during the photolithographic process at the image plane using the one or more mask patterns 840 at the object plane. If termination criterion 848 is not met, analysis module 830 revises the one or more sets of polygon parameters 836, repeating the calculation of the one or more mask patterns 840 and the evaluating of the one or more cost functions 846 until termination criterion 848 is met.

Note that photolithography simulator 832 may calculate the one or more estimated target pattern 850 using the one or more mask patterns 840, at least one of the one or more optical paths 844 and a photoresist model 852.

In some embodiments, prior to determining the one or more sets of polygon parameters 836, analysis module 830 generates the one or more modified target patterns 838 by performing one or more symmetry operations 854 on at least a portion of one or more of target patterns 834. Additionally, in some embodiments, prior to evaluating the one or more cost functions 846, analysis module 830 calculates one or more source patterns 856 associated with the one or more mask patterns 840, which may be used in simulations of the photolithographic process.

Instructions in the various modules in memory 824 may be implemented in a high-level procedural language, an object-oriented programming language, and/or in an assembly or machine language. The programming language may be compiled or interpreted, i.e., configurable or configured to be executed, by the one or more processing units 810.

In some embodiments, at least some of the information in memory 824 is encrypted. For example, the photolithographic simulator 832 and/or its output files may be encrypted. Moreover, information 'stored' in memory 824 in FIG. 8 may be stored locally and/or at remote locations.

Although the computer system 800 is illustrated as having a number of discrete items, FIG. 8 is intended to be a functional description of the various features that may be present in the computer system 800 rather than as a structural schematic of the embodiments described herein. In practice, and as recognized by those of ordinary skill in the art, the functions of the computer system 800 may be distributed over a large number of servers or computers, with various groups of the servers or computers performing particular subsets of the functions. In some embodiments, some or all of the functionality of the computer system 800 may be implemented in one or more ASICs, one or more field programmable gate arrays (FPGAs), and/or one or more digital signal processors (DSPs). In some embodiments the functionality of the computer system 800 may be implemented more in hardware and less in software, or less in hardware and more in software, as is known in the art.

In the preceding discussion, a 'computer system' may include a variety of devices, such as: a personal computer, a laptop computer, a mainframe computer, a portable electronic device, a server and/or a client computer (in a client-server architecture), and/or other device capable of manipulating computer-readable data or communicating such data between two or more computing systems over a network (such as the Internet, an Intranet, a LAN, a WAN, a MAN, or combination of networks, or other technology enabling communication between computing systems).

In some embodiments, LEED system 200 (FIG. 2), inverse optical calculation 400 (FIG. 4), forward optical calculation 500 (FIG. 5), mask pattern 600 and corresponding level-set functions 614 (FIG. 6), computer system 800, and/or image data structure 900 (FIG. 9) include fewer or additional components. Furthermore, in these embodiments two or more components are combined into a single component and/or a position of one or more components may be changed.

While the preceding discussion used a photolithography as an illustrative example, in other embodiments the calculation technique may be applied to mask-less lithography. In these embodiments, the inverse optical calculation may be used to determine a write pattern instead of a mask pattern.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for determining a modified target pattern associated with an integrated-circuit design, comprising:
   receiving at least a portion of a target pattern associated with the integrated-circuit design, wherein the target pattern includes polygons that represent features in the integrated-circuit design;
   determining a set of polygon parameters in the modified target pattern, wherein the set of polygon parameters include polygon positions in the modified target pattern and areas of the polygons;
   calculating, using a computer, a mask pattern that can be used in a photolithographic process to fabricate the modified target pattern on a semiconductor die, wherein the mask pattern is calculated using an inverse optical calculation in which the modified target pattern is at an image plane of an optical path associated with the photolithographic process and the mask pattern is at an object plane of the optical path, and the inverse optical calculation is applied to the modified target pattern to calculate the mask pattern;
   evaluating a cost function to determine when the termination criterion is met, wherein the cost function corresponds to a difference between the modified target pattern and an estimated target pattern produced during the photolithographic process at the image plane using the mask pattern at the object plane; and
   when the termination criterion is not met, revising the set of polygon parameters, repeating the calculation of the mask pattern and the evaluating of the cost function until the termination criterion is met.

2. The method of claim 1, wherein, prior to calculating the mask pattern, the polygons have the same area.

3. The method of claim 1, wherein the set of polygon parameters includes placement of edges in each of the polygons; and
   wherein placement of a given edge in a given polygon is along a direction perpendicular to the given edge.

4. The method of claim 3, wherein the given edge is subdivided into portions of the given edge that are independently positioned so that they are offset along the direction from each other.

5. The method of claim 4, wherein, when the set of polygon parameters is revised, the placement of the portions of the given edge are constrained so that the offset, if present, is retained.

6. The method of claim 1, wherein, when the set of polygon parameters is revised, a total area of all of the polygons is constrained to have a constant value.

7. The method of claim 1, wherein, prior to determining the set of polygon parameters, the method further comprises generating the modified target pattern by performing one or more symmetry operations on at least a portion of the target pattern.

8. The method of claim 7, wherein the symmetry operations include at least one of: a rotation operation on one or more polygons in at least the portion of the target pattern, a reflection operation on the one or more polygons in at least the portion of the target pattern, and a translation operation on the one or more polygons in at least the portion of the target pattern.

9. The method of claim 1, wherein, prior to evaluating the cost function, the method further includes calculating a source pattern associated with the mask pattern.

10. The method of claim 1, wherein evaluating the cost function involves determining the estimated target pattern; and
    wherein determining the estimated target pattern involves a model of a photo-resist used during the photolithographic process.

11. The method of claim 1, wherein the cost function is a metric of manufacturability of the modified target pattern, the mask pattern or both.

12. The method of claim 1, wherein the difference between the modified target pattern and the estimated target pattern is the maximum difference between the modified target pattern and in a set of estimated target patterns produced during photolithographic processes at one or more image planes using the mask pattern the object plane.

13. A computer-program product for use in conjunction with a computer system, the computer-program product comprising a non-transitory computer-readable storage medium and a computer-program mechanism embedded therein to determine a modified target pattern associated with an integrated-circuit design, the computer-program mechanism including:
    instructions for receiving at least a portion of a target pattern associated with the integrated circuit design, wherein the target pattern includes polygons that represent features in the integrated circuit design;

instructions for determining a set of polygon parameters in the modified target pattern, wherein the set of polygon parameters include polygon positions in the modified target pattern and areas of the polygons;

instructions for calculating a mask pattern that can be used in a photolithographic process to fabricate the modified target pattern on a semiconductor die, wherein the mask pattern is calculated using an inverse optical calculation in which the modified target pattern is at an image plane of an optical path associated with the photolithographic process and the mask pattern is at an object plane of the optical path, and the inverse optical calculation is applied to the modified target pattern to calculate the mask pattern;

instructions for evaluating a cost function to determine when the termination criterion is met, wherein the cost function corresponds to a difference between the modified target pattern and an estimated target pattern produced during the photolithographic process at the image plane using the mask pattern at the object plane; and instructions for revising the set of polygon parameters, repeating the calculation of the mask pattern and the evaluating of the cost function, when the termination criterion is not met, until the termination criterion is met.

14. The computer-program product of claim 13, wherein, prior to calculating the mask pattern, the polygons have the same area.

15. The computer-program product of claim 13, wherein the set of polygon parameters includes placement of edges in each of the polygons; and wherein placement of a given edge in a given polygon is along a direction perpendicular to the given edge.

16. The computer-program product of claim 15, wherein the given edge is subdivided into portions of the given edge that are independently positioned so that they are offset along the direction from each other.

17. The computer-program product of claim 16, wherein, when the set of polygon parameters is revised, the placement of the portions of the given edge are constrained so that the offset, if present, is retained.

18. The computer-program product of claim 13, wherein, when the set of polygon parameters is revised, a total area of all of the polygons is constrained to have a constant value.

19. The computer-program product of claim 13, wherein, prior to determining the set of polygon parameters, the computer-program mechanism further includes instructions for generating the modified target pattern by performing one or more symmetry operations on at least a portion of the target pattern.

20. The computer-program product of claim 19, wherein the symmetry operations include at least one of: a rotation operation on one or more polygons in at least the portion of the target pattern, a reflection operation on the one or more polygons in at least the portion of the target pattern, and a translation operation on the one or more polygons in at least the portion of the target pattern.

21. A computer system, comprising:
at least one processor;
at least one memory; and
at least one program module, the program module stored in the memory and configured to be executed by the processor to determine a modified target pattern associated with an integrated-circuit design, the program module including:

instructions for receiving at least a portion of a target pattern associated with the integrated-circuit design, wherein the target pattern includes polygons that represent features in the integrated-circuit design;

instructions for determining a set of polygon parameters in the modified target pattern, wherein the set of polygon parameters include polygon positions in the modified target pattern and areas of the polygons;

instructions for calculating a mask pattern that can be used in a photolithographic process to fabricate the modified target pattern on a semiconductor die, wherein the mask pattern is calculated using an inverse optical calculation in which the modified target pattern is at an image plane of an optical path associated with the photolithographic process and the mask pattern is at an object plane of the optical path, and the inverse optical calculation is applied to the modified target pattern to calculate the mask pattern;

instructions for evaluating a cost function to determine when the termination criterion is met, wherein the cost function corresponds to a difference between the modified target pattern and an estimated target pattern produced during the photolithographic process at the image plane using the mask pattern at the object plane; and instructions for revising the set of polygon parameters, repeating the calculation of the mask pattern and the evaluating of the cost function, when the termination criterion is not met, until the termination criterion is met.

* * * * *